(12) United States Patent
Han

(10) Patent No.: US 6,262,581 B1
(45) Date of Patent: Jul. 17, 2001

(54) TEST CARRIER FOR UNPACKAGED SEMICONDUCTER CHIP

(75) Inventor: Chan Min Han, Kyungki-co (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/229,734

(22) Filed: Jan. 13, 1999

(30) Foreign Application Priority Data

Apr. 20, 1998 (KR) .................................................. 98-14006

(51) Int. Cl.[7] ................................................ G01R 31/02
(52) U.S. Cl. ........................ 324/755; 324/755; 324/765
(58) Field of Search .................................. 324/754, 755, 324/765; 439/67, 513, 66, 70–76; 438/14, 17, 18; 257/40, 48

(56) References Cited

U.S. PATENT DOCUMENTS

| | | | |
|---|---|---|---|
| 5,088,190 | * 2/1992 | Malhi et al. | 439/513 |
| 5,123,850 | * 6/1992 | Elder et al. | 439/67 |
| 5,302,891 | * 4/1994 | Wood et al. | 324/765 |
| 5,543,725 | * 8/1996 | Lim et al. | 324/755 |
| 5,656,945 | * 8/1997 | Cain | 324/765 |

\* cited by examiner

*Primary Examiner*—Vinh P. Nguyen
(74) *Attorney, Agent, or Firm*—Skjerven Morrill MacPherson LLP; Don C. Lawrence

(57) ABSTRACT

A carrier for use in testing an unpackaged semiconductor chip includes a body having a cavity for receiving the chip, inner contact elements and conductors for contacting connection pads on the chip and electrically connecting them to connection elements on an outside surface of the carrier, and rotatable clamps for holding the chip in the cavity. The carriers are configured to enable them to engage and mate with conventionally packaged chip test sockets, thereby enabling their use with conventional automated chip handling and testing equipment, and hence, the production of known good devices on a mass production basis.

19 Claims, 8 Drawing Sheets

TEST CARRIER FOR UNPACKAGED SEMICONDUCTER CHIP

BACKGROUND

1. Field of the Invention

The present invention relates to an apparatus for testing an electrical device, and more particularly, to an apparatus for testing an unpackaged, or bare, microchip.

2. Description of the Related Art

A need for more compact electronic devices has accelerated development of multi-chip modules (MCM's) which contain multiple semiconductor chips in a single package. However, the successful introduction of multi-chip modules to a commercial market requires a technology for producing known good dies (KGD's), i.e., bare chips that are as reliable as packaged chips. Therefore, there is a need in the industry for technologies that can test bare chips, both physical and electrical reliability tests, such as burn-in tests and electrical performance tests, in a reliable and cost-effective manner.

Two types of bare chip testing methods are available. One is a wafer-level test, and the other is a die-level test. In general, the wafer-level test has several technical difficulties associated with it. For example, a probe card having probes at a sufficiently fine pitch is difficult to fabricate. A conventional probe card often causes contact failures due to a slight bending of the probes. Further, the trend in the industry is toward larger wafers, with more chips per wafer and a higher degree of integration of circuitry into the chips, which exacerbates the problem.

In contrast, the die-level test is performed after the wafer is sawn into individual dies, or chips. A typical die-level test employs a carrier to mount and carry a bare, or unpackaged, chip during testing. The chip undergoes all the same reliability and electrical tests as a packaged chip while contained in the test carrier. For example, the carrier containing the bare chip is inserted into a test socket for an electrical performance test of the chip. After all the tests are completed, the bare chips are unloaded from the carriers, and the chips that passed the tests are designated as known good dies.

A typical carrier for testing bare chips is described in U.S. Pat. Nos. 5,543,725 and 5,656,945, which are both hereby incorporated by reference in their entireties. In U.S. Pat. No. 5,543,725, a carrier is described which has a cavity to receive a bare chip, and a "head" to establish a good contact between the bare chip and the carrier. In U.S. Pat. No. 5,656,945, a carrier is disclosed which has the shape of a commercial chip package, and a head to press a bare chip into the carrier so as to ensure a good electrical connection between the chip and contact terminals of the carrier. In the test methods using the carriers described in the above references, the loading/unloading of the bare chip must be carried out manually because the loading/unloading cannot be adapted to existing automated chip handling equipment.

SUMMARY OF THE INVENTION

The present invention provides a chip carrier for testing a bare microchip that enables the production of known good dies on a large scale using conventional automated semiconductor handling and test equipment.

According to a first preferred embodiment of the present invention, a carrier includes a carrier body having an open cavity formed in a top surface thereof to receive a bare chip, and a stepped relief formed along two opposing sides of the cavity. Inner contact elements are disposed on the bottom of the cavity to contact selected connection pads on the chip. Outer contact elements, which preferably comprise solder balls, are disposed on a bottom surface of the substrate body and are electrically connected to the inner contact pads. The outer contact elements and substrate body are configured to engage and mate with a test socket for a conventional ball grid array (BGA) packaged chip.

Means for retaining the chip in the carrier include an arcuate pressure clamp having a jaw and a tail rotationally biased about a fixed pin by means of a spring. The jaw is biased toward the bottom of the cavity and the tail extends into the stepped relief. To load a chip in the carrier, the tail is forced down such that the jaw rotates up and away from the cavity about the fixed pin. When the chip is correctly installed in the cavity, the force on the tail of the clamp is removed so that the biasing spring rotates the jaw back toward the floor of the cavity to retain the chip in place and force connection pads on the chip into electrical contact with inner contact elements located on the floor of the cavity.

According to another preferred embodiment of the present invention, the carrier body comprises a lower body having an open cavity to receive a bare chip, an upper body with an opening through it to expose the cavity in the lower body; and means for coupling the upper and lower bodies together and for biasing them apart at a predetermined distance.

Inner contact elements are arrayed on the bottom of the cavity to contact selected connection pads on the chip. Outer contact elements, which preferably comprise leads, are electrically connected to the inner contact elements and are formed on the side surfaces of the lower body. The outer contact elements and carrier bodies are configured to be compatible with a test socket for a conventional lead-type microchip package, such as a Small Outline Package (SOP), a Small Outline J-leaded Package (SOJ), or a Dual In-line Package (DIP).

Means for retaining the chip in the carrier of the second embodiment include a resilient pressure clamp, a clamp deflector and a retainer. The clamp has a multi-toothed, arcuate jaw that extends inwardly toward the chip cavity in the lower body, and a tail that extends outwardly from the cavity and is fixed to the bottom of the upper body. The clamp deflector is positioned below the clamp and outside the cavity. The retainer holds the upper and lower bodies together in their spaced-apart relationship. When the upper body is forced toward the lower body, the clamp deflector flexes the jaw of the clamp upward and outward from the cavity so that the chip can be loaded into the cavity through the opening in the upper body. After the chip is placed in the cavity and the force on the upper body is removed, the coupling means bias the upper body upward, away from the lower body, permitting the jaw of the resilient clamp to flex downwardly and inwardly to engage and retain the chip in place on the floor of the cavity.

The retainer protects the carrier from external forces and enables it to retain its spaced-apart relationship, thereby maintaining a steady pressure on the chip and electrical contact between the chip contacts and those on the carrier. Thus, when it is necessary to apply an external force to the carrier, e.g., to insert it into a test socket, the force is applied to the retainer, and not the body of the carrier.

BRIEF DESCRIPTION OF THE DRAWINGS

These and various other features and advantages of the present invention will be readily understood with reference to the following detailed description, particularly if taken in conjunction with the accompanying drawings, in which like reference numerals designate like structural elements.

DETAILED DESCRIPTION OF THE PREFERRED EMBODIMENTS

Figure 1:
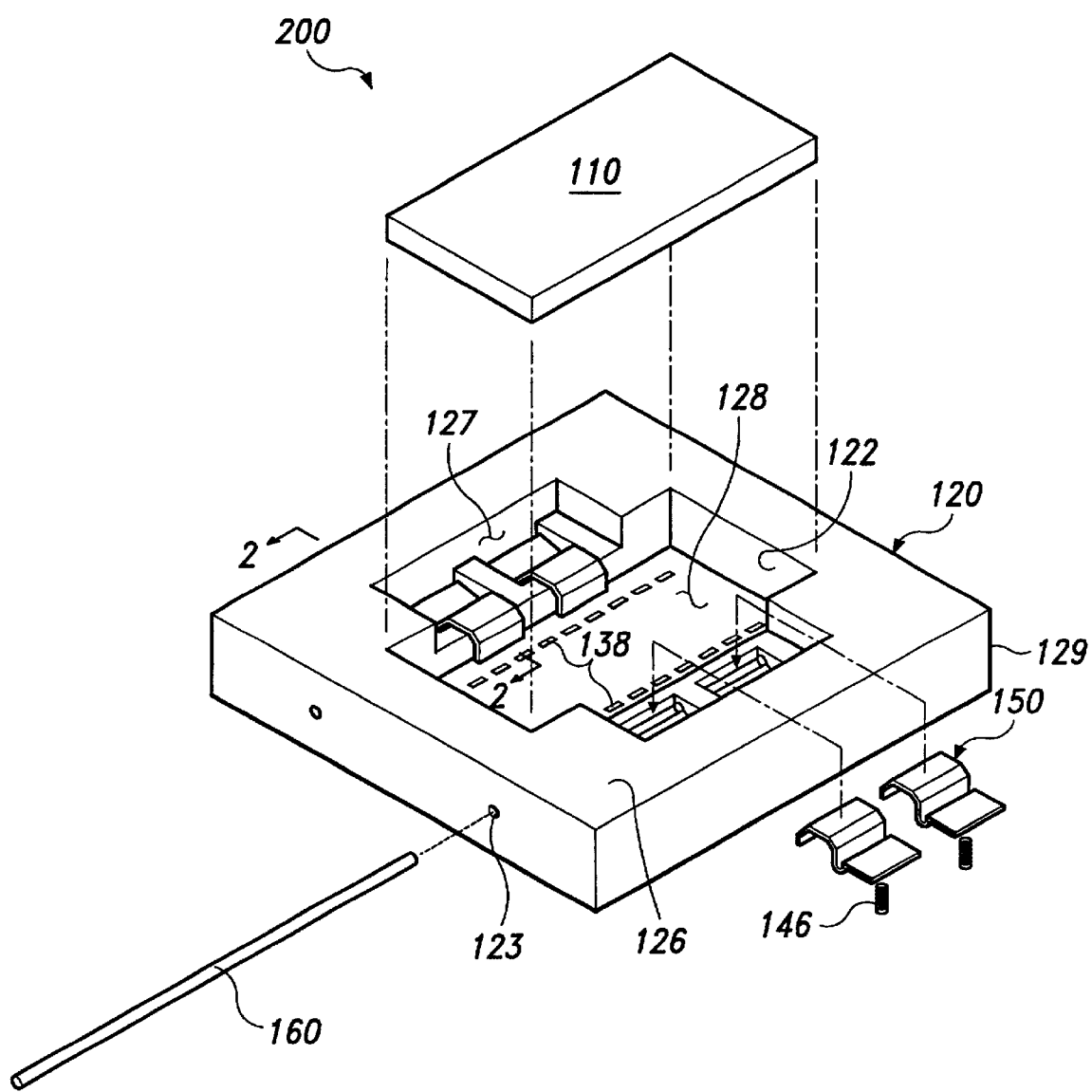
FIG. 1 is an exploded perspective view of a ball grid array type of carrier for testing a bare chip according to one embodiment of the present invention.
Figure 2:
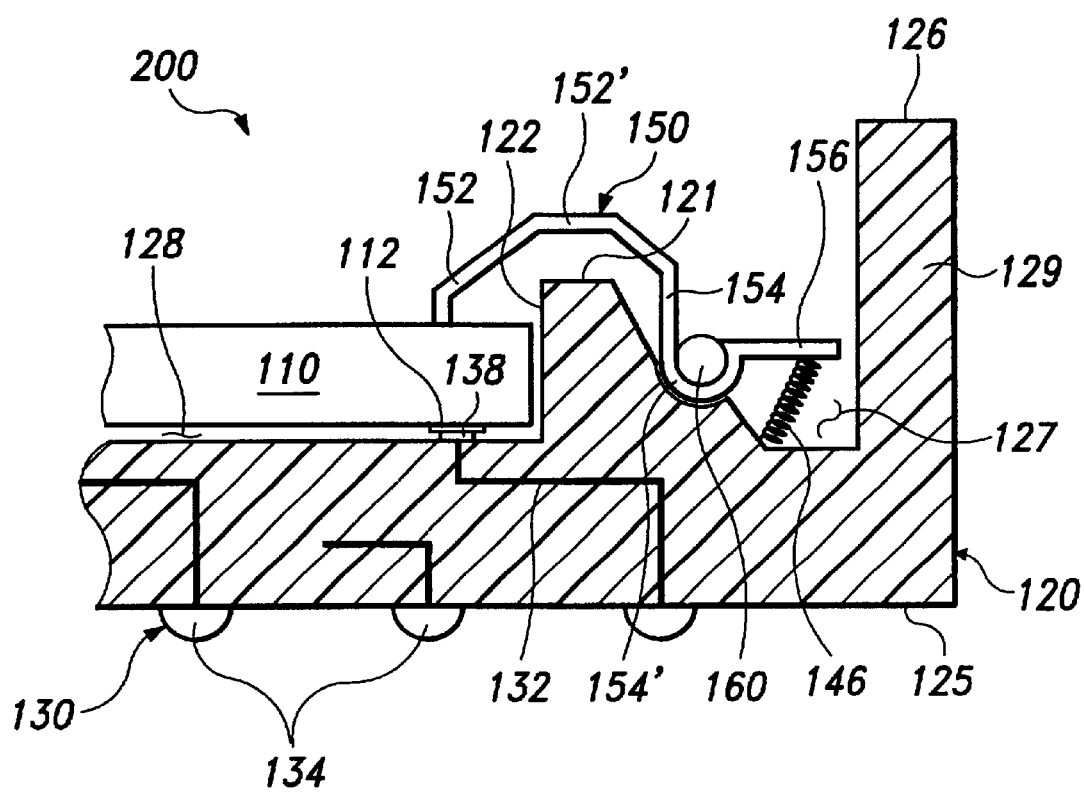
FIG. 2 is an enlarged partial cross-sectional view of the carrier taken along the line '2—2' of FIG. 1.

FIG. 1 is an exploded perspective view of a BGA-type carrier 200 for testing a bare chip 110 according to one embodiment of the present invention, and FIG. 2 is a cross-sectional view of the carrier 200 taken along the line '2—2' of FIG. 1.

With reference to FIGS. 1 and 2, the carrier 200 includes a carrier body 120 having a cavity 128 in a top surface 126 thereof to receive the microchip 110. The carrier 200 also has a number of contact terminals 130, each of which comprises an inner contact element 138 disposed on the floor of cavity 128 to contact a connection pad 112 on the chip 110, and an outer contact element 134 which is formed on a bottom surface 125 of the body 120 and connected to the inner contact element 138. The carrier 200 further includes clamping means, described below, for holding the chip 110 in the cavity 128 during testing.

In the exemplary embodiment illustrated, the body 120 is analogous to a conventional substrate 129, such as a printed circuit board. The inside walls 122 of the cavity 128 serve to guide the chip 110 into the cavity 128, and to position it with respect to the carrier contacts. The inner contact elements 138 are formed on and protrude slightly upward from the floor of the cavity 128. Stepped recesses 127 are formed on two opposite sides of the cavity 128 to mount the chip retaining means.

The contact elements 130 include inner contact elements 138 on the floor of the cavity 128, outer contact elements 134 on bottom surface 125 of the body 129, and internal conductors 132 that electrically connect the inner contact elements 138 to the outer contact element 134. The inner contact elements 138 are formed at positions corresponding to selected connection pads 112 on the chip 110. The outer contact elements 134 comprise, in the embodiment illustrated, solder bumps. The outer contact elements 134 and body 120 are configured to engagingly mate with a conventional BGA package test socket (not shown). The carrier 200 retains the chip 110 in the cavity 128 in such a way that the chip 110 is electrically interconnected with the outer contact elements 134 of the carrier 200 when the carrier is inserted to a test socket for testing of the chip 110. After it is tested, the chip 110 is removed from carrier 200 and sorted, depending on the test results.

The clamping means hold the chip 110 in the cavity 128 during testing and enable the chip 110 to be easily removed from the carrier 200 after testing. The retaining means include a clamp 150 having an arcuate jaw 152 and an straight tail 156, a fixed pin 160, and a resilient member 146, such as a spring. The clamp 150 is rotatably biased about the pin 160 by the spring 148 within the stepped recess 127 to hold the chip 110 in the cavity 128 and to press it against the floor of the cavity, thereby ensuring good electrical contact between the pads 112 on the chip and the inner contact elements 38. The spring 146 is placed at the tail end of the clamp 150 to bias the jaw end of the clamp 150 toward the floor of the cavity 128.

The clamp 150 comprises an arcuate jaw portion 152' disposed inboard of the pin 160, a semi-cylindrical bearing portion 154' connected to the arcuate portion 152' by a straight connecting arm portion 154, and a straight tail 156 extending outboard from the bearing portion 154' and the pin 160. The arcuate jaw portions 152' and bearing portions 154' together form a "S"-shaped curve, as shown in FIG. 2. The inboard end of the jaw 152 is located above the cavity 128, and the connecting arm portion 154, the bearing portion 154', and the tail 156 of the clamp 150 are located entirely within the stepped recess 127.

The stepped recesses 127 are described with reference to FIGS. 2 and 3. Each recess 127 has a semi-cylindrical groove 127', at least one step 127b, and an inside wall 127d that inclines inwardly toward the cavity 128. The semi-cylindrical groove 127' extends along the inside wall 127d and is adapted to receive the bearing portion 154' of the clamp 150 and the pin 160 in a coaxial relationship such that the bearing portion 154' of the clamp 150 is rotatably journalled within the groove 127' about the fixed pin 160. Thus, an application of a downward force on the tail 156 of the clamp rotates the clamp 150 about the pin 160 and rotates the jaw 152 upwardly and out of the cavity 128.

Through-holes 123 are formed in the carrier body 120 for insertion of the fixing pins 160. The pins 160 extends coaxially through the semi-cylindrical bearing portions 154' of the clamps 150 so that the pins 160 both retain the clamps 150 in the body 120 and permit them to rotate as described above. A resilient member 146, such as the spring illustrated, is provided between the tail 156 and the floor of the step 127b of the recess 127 to bias the jaw 152 of the clamp 150 toward the floor of the cavity 128.

Figure 3:
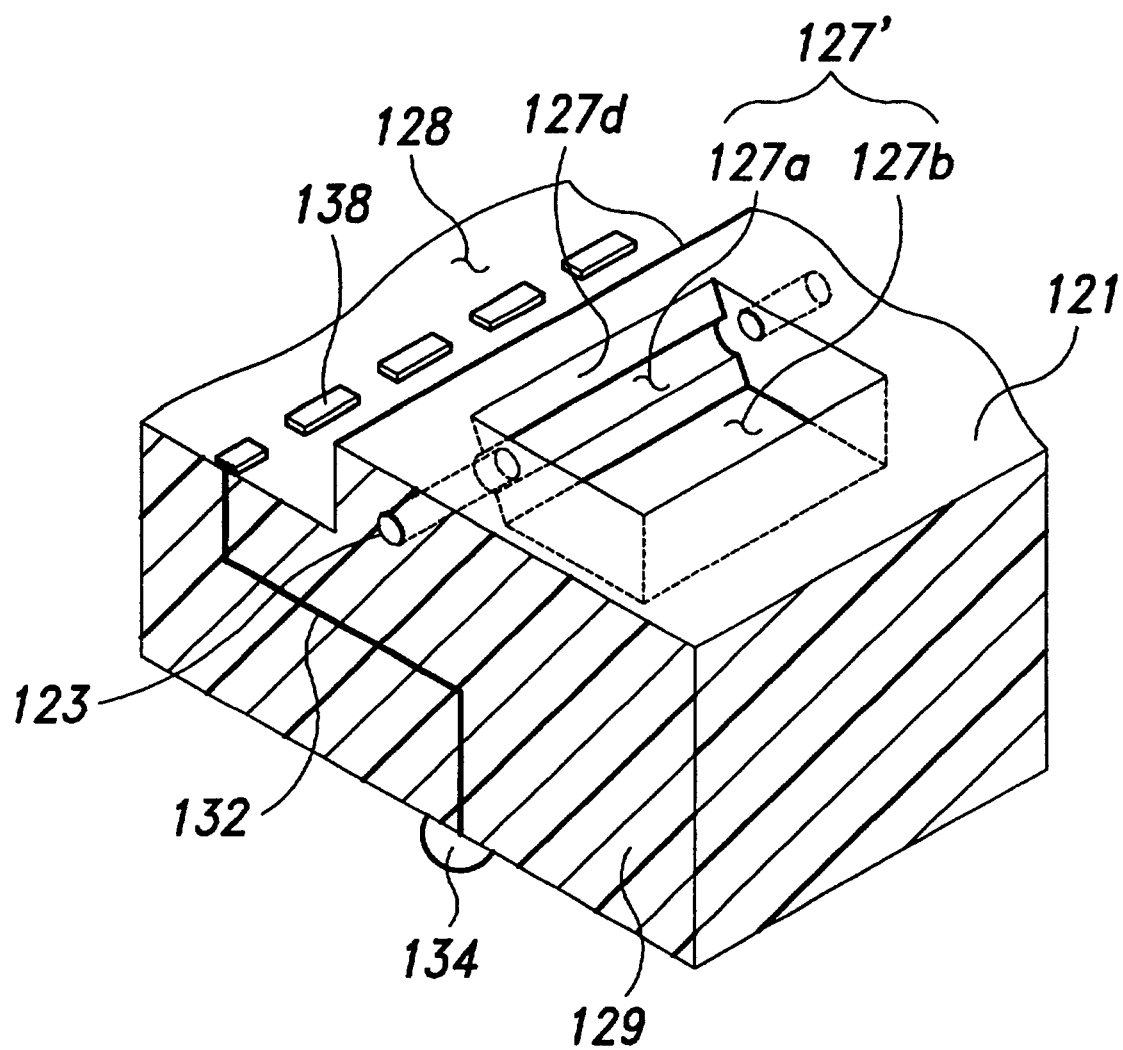
FIG. 3 is an enlarged partial cut-away perspective view of the carrier of FIG. 1.

Referring to FIGS. 2 and 3, the installation sequence of the retaining means is as follows. First, the resilient member 146 is positioned in the step 127', and the bearing portion 154' of the clamp 150 is fitted into the semi-cylindrical groove 127a, with the jaw 152 of clamp 150 extending into the cavity 128 and the tail 156 of the clamp 150 extending outwardly from the cavity. The fixing pin 160 is then inserted through the holes 123 so that the pin 160 extends coaxially through the bearing portions 154' of the clamp. Regarding the resilient member 146, it is preferable that, when the resilient member 146 is completely extended, i.e., uncompressed, the space between the tip of the clamp jaw 152 and the floor of the cavity 128 be smaller than the thickness of a chip 110. Stated alternately, it is preferable that the resilient members 146 be slightly compressed whenever a chip 110 is installed in the carrier 200 so that the chip 110 is retained in the cavity 128 by the clamps 150 with a positive, non-zero clamping force.

If the clamp 150 were to protrude above the top surface 126 of the body 120, an external impact might damage the clamp 150 during handling of the carrier 200. Accordingly, it is preferable to form a second step 121 within the recess 127 between the cavity 128 and the first step so that the clamp 150 is always entirely recessed below the top surface 126 of the body 120, regardless of its rotational position.

Figure 4:
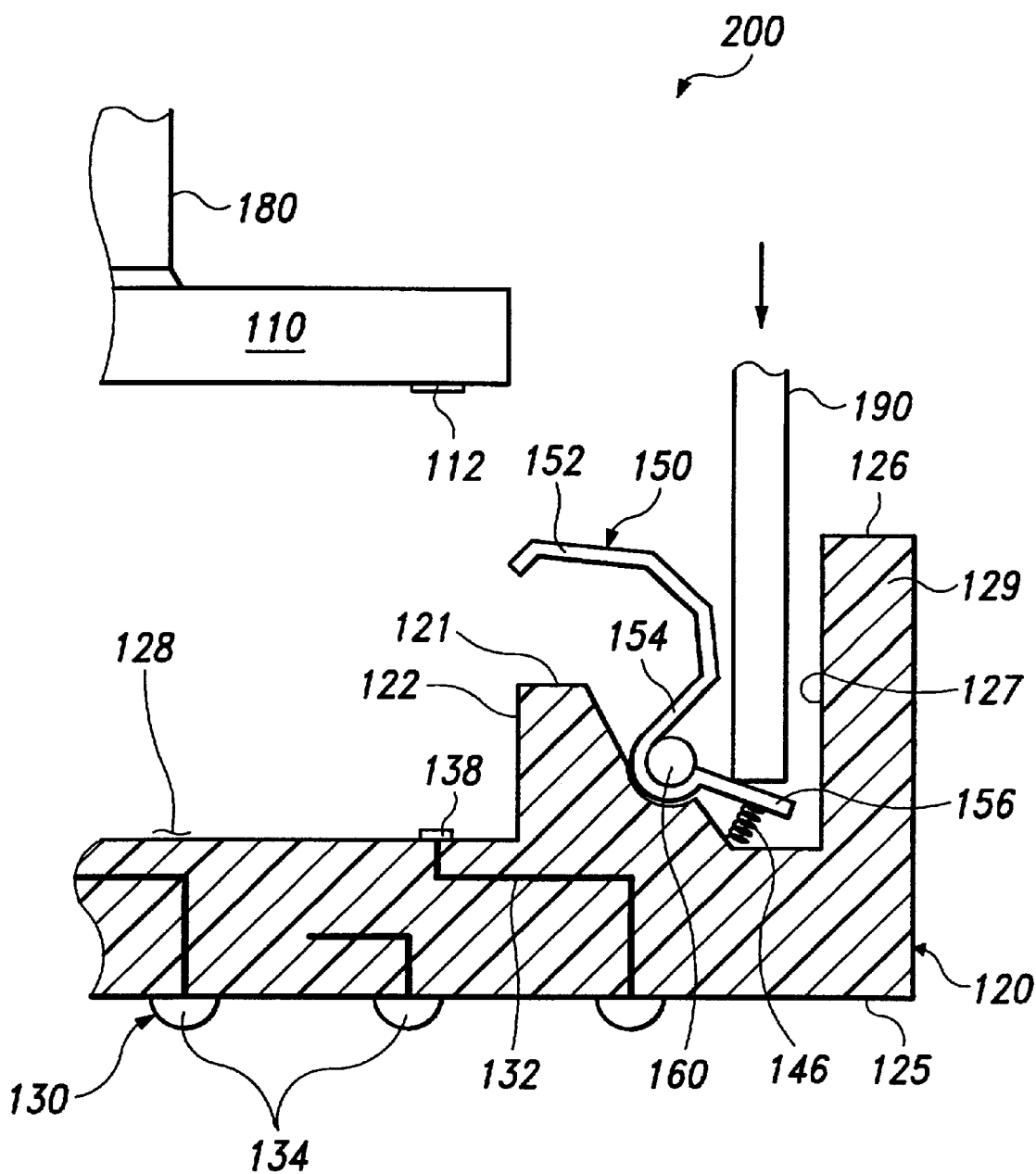
FIG. 4 is a partial cross-sectional view depicting pre-insertion alignment of a chip with a cavity in the carrier of FIG.1.
Figure 5:
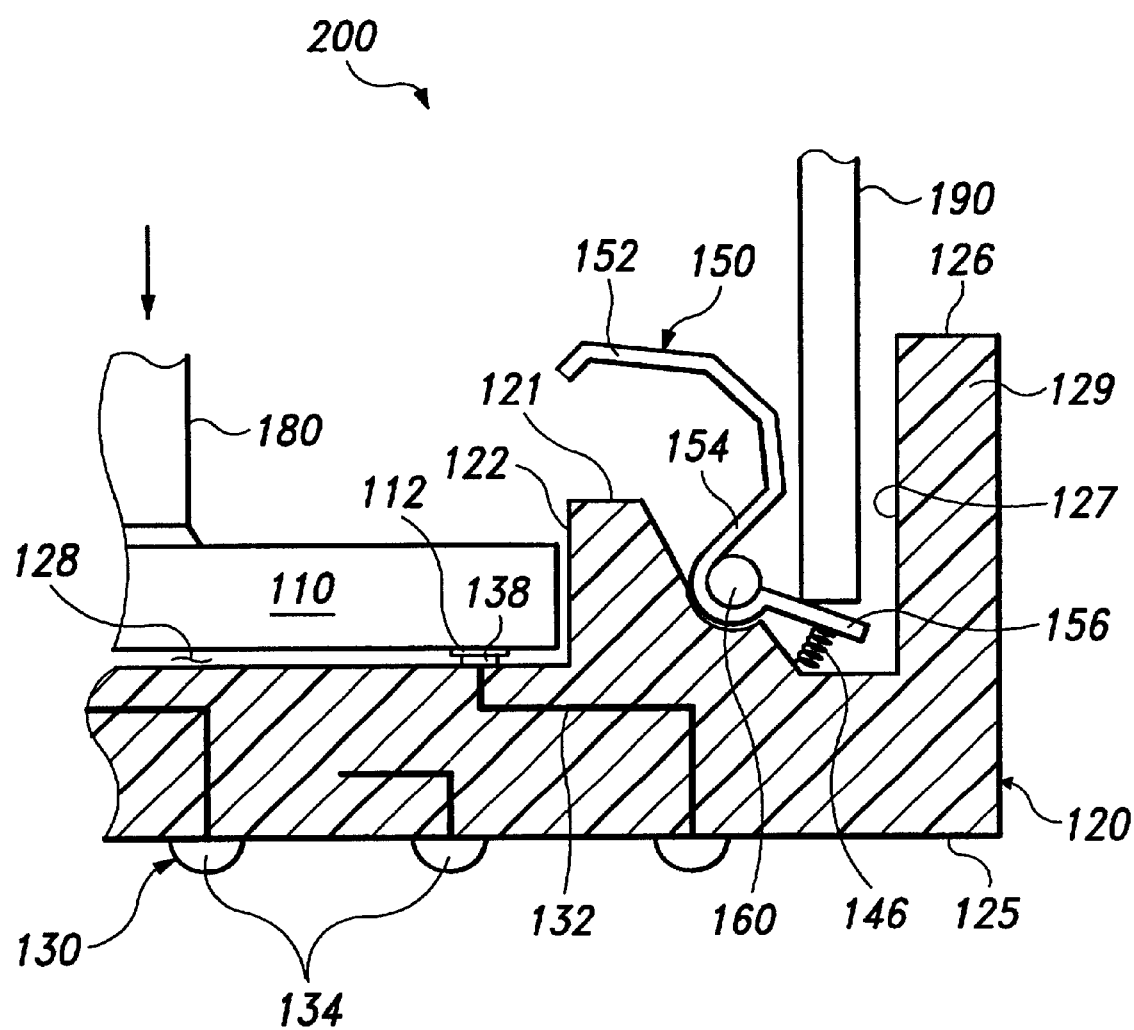
FIG. 5 is a partial cross-sectional view of the chip inserted into the cavity of the carrier of FIG. 1.
Figure 6:
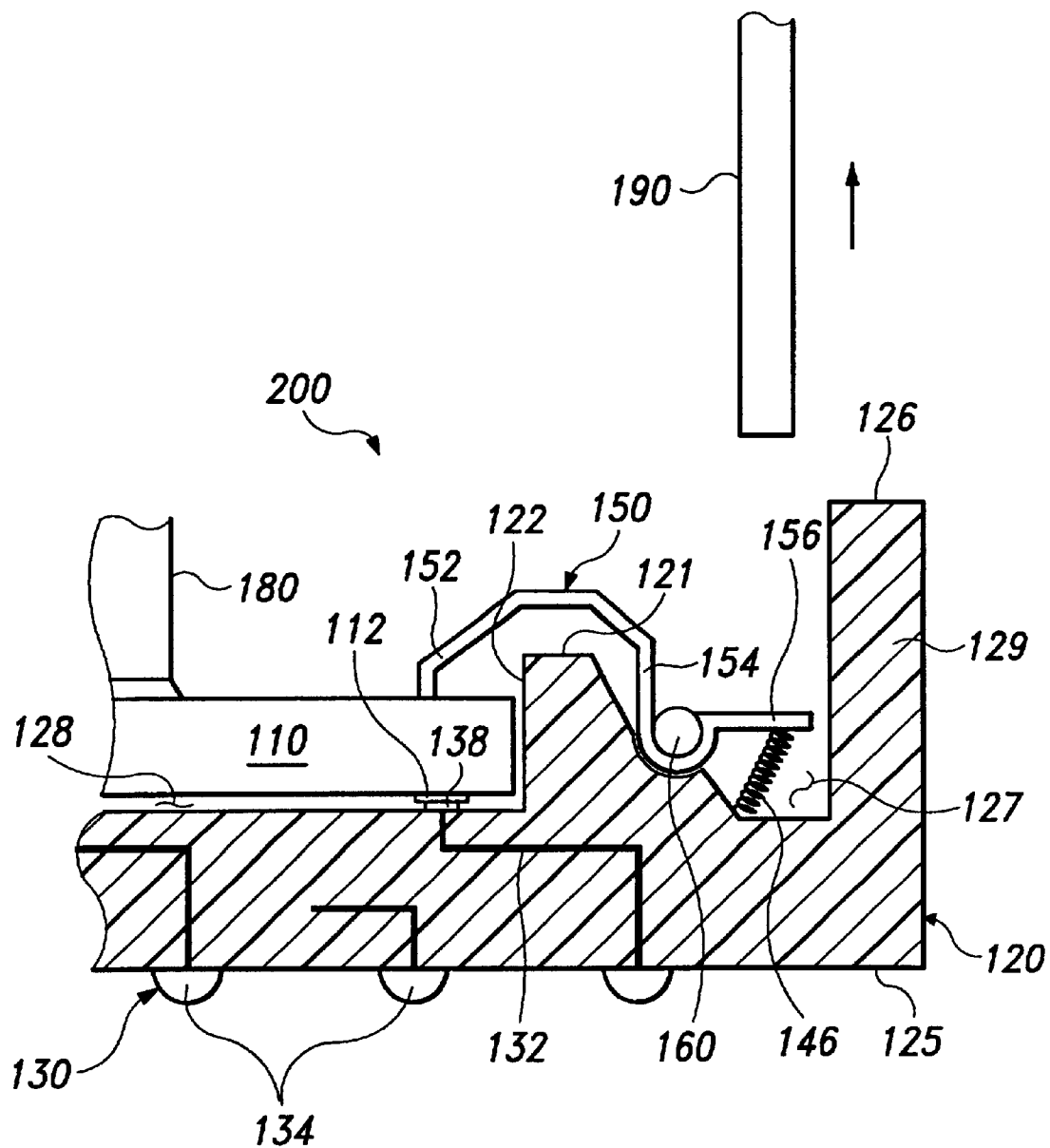
FIG. 6 is a partial cross-sectional view of the chip retained in the cavity of the carrier of FIG. 1.

The process of loading a chip 110 into carrier 200 is now described. Referring to FIGS. 4, 5 and 6, a pusher 190 presses the tail 156 of the clamp 150 downward so that the jaw 152 of the clamp 150 moves upward and out of the boundary of the cavity 128. An automated pick-and-place tool 180, e.g., one having a vacuum collect, then picks up a chip 110 for insertion into the cavity. In this regard, it may be noted that the connection pads 112 on a chip are typically, but not always, disposed on the top surface of the chip. Thus, it may be necessary to invert the chip 110 so that the connection pads 112 face toward the floor of the cavity 128 prior to insertion of the chip 110 into the carrier.

The tool 180 transports the chip to a position above the carrier 200, aligns it with the cavity 128, and inserts it downward into the cavity 128 so that the inner contact elements 138 make contact with selected ones of the connection pads 112 on the surface of the chip 110. Then, with the tool 180 still holding the chip 10 in contact with the inner contact elements 138, the pusher 190 retracts from tail 156 of the clamp 150 such that the resilient members 146 bias the head 152 of the clamp 150 downwardly and inwardly to engage and hold the chip 110 in the cavity 128, with its connection pads in contact with the inner contact elements 138. Preferably, each of the clamps 150 exert a force of about 10 to 20 grams on the margin of the chip 110. When the chip 110 is fully retained by the clamps 150, the pick-and-place tool 180 releases the chip 110 and retracts from chip 110 to complete the chip loading process. The process of unloading the chip 110 from the carrier 200 is substantially the reverse of the above procedure.

Figure 7:
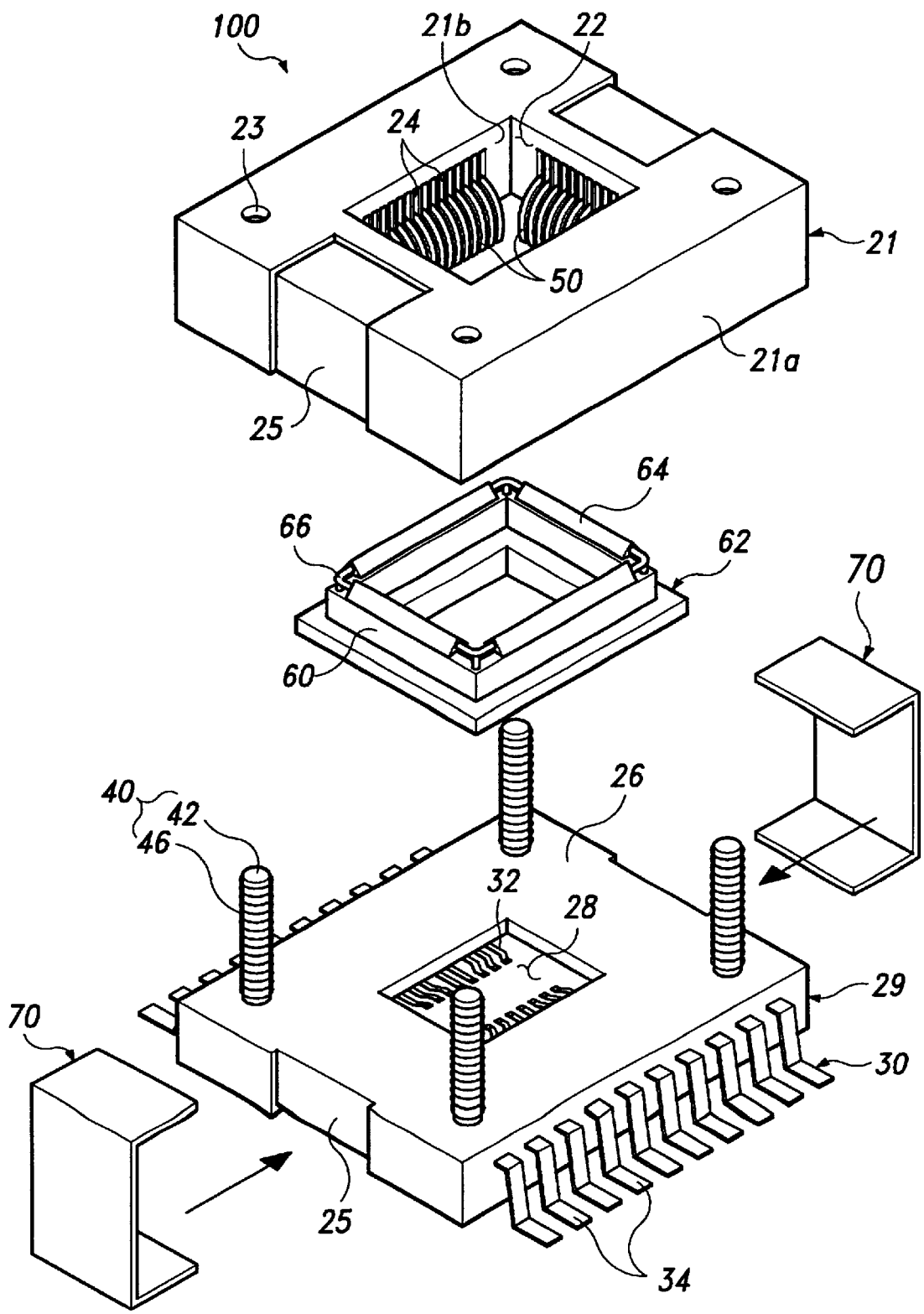
FIG. 7 is an exploded perspective view of a lead type carrier for testing a bare chip according to another preferred embodiment of the present invention; and, FIG. 8 is a partial cross-sectional view of the carrier of FIG. 7.
Figure 8:
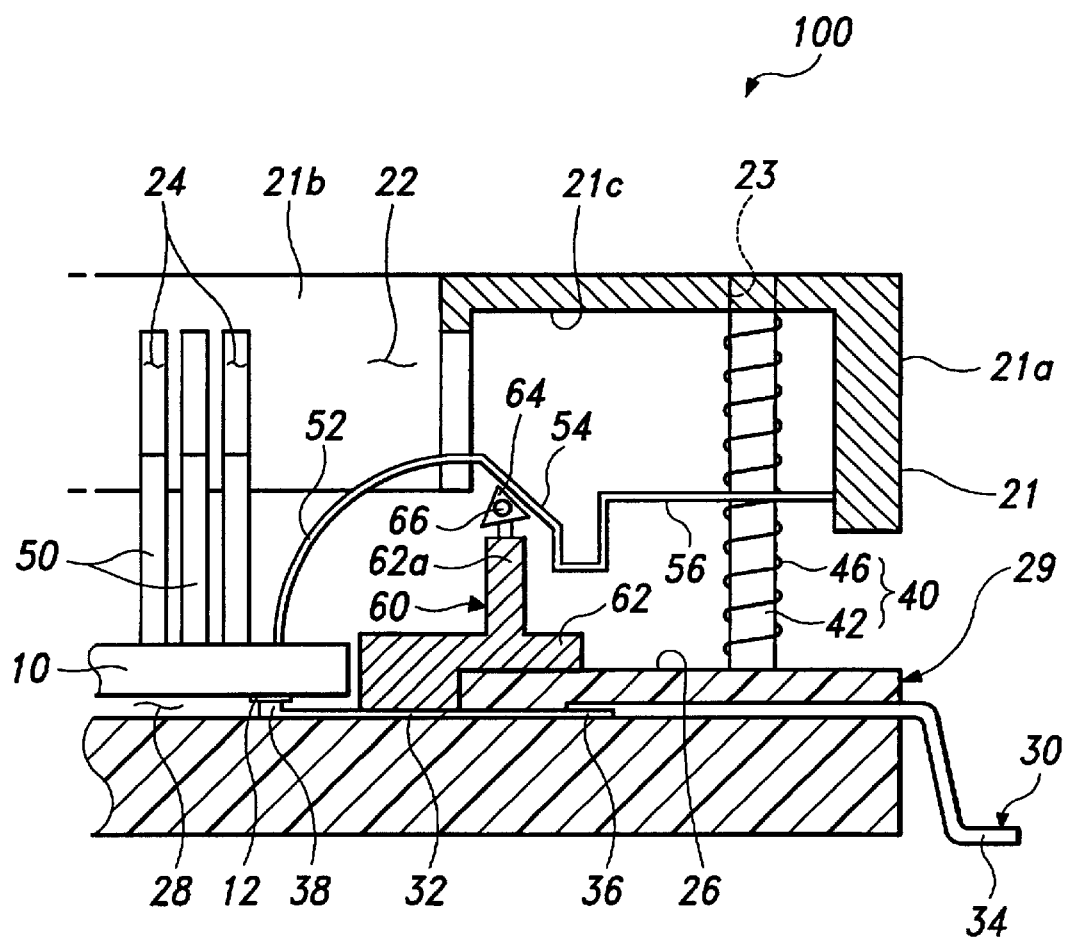

FIG. 7 illustrates a second preferred embodiment of a carrier 100 in accordance with the present invention, and shows an exploded view of a lead-type carrier 100 for testing a bare chip 10. FIG. 8 is a partial cross-sectional view of the carrier 100 seen in FIG. 7.

Referring to FIGS. 7 and 8, the second embodiment of the test carrier 100 includes a lower body 29, an upper body 21 and means 40 for coupling the lower body 29 to the upper body 21. The carrier 100 further includes means for holding a chip 10 in the cavity 28, which are described in more detail below.

The lower body 29 includes an open cavity 28 in a top surface 26 of the lower body 29 to receive a bare chip 10, and contact terminals 30, each of which comprises an inner contact element 32 and an outer contact element 34. The inner contact elements 30 are arranged on the floor of the cavity 28 to contact selected connection pads 12 on the chip 10. The outer contact elements 34 extend from the sides of the lower body 29 and are electrically connected to the inner contact elements 32. The outer contact elements 34 and the lower body 20 are configured to engage and mate with a conventional test socket (not shown) which is adapted to receive a conventional semiconductor package. For testing purposes, the carrier 100 carrying the chip 10 is inserted into the test socket (not shown), and after testing, the chip 10 is removed from the carrier 100 and sorted according to the test results.

More specifically, the outer contact elements 34, the upper body 21, and the lower body 29 are configured to mate and engage with a conventional test socket adapted to receive a conventional plastic package, such as a Small Outline Package (SOP), a Small Outline J-leaded Package (SOJ), a Dual In-line Package (DIP), to enable the use of conventional package test sockets for testing unpackaged chips. In the embodiment shown in FIG. 7, the carrier 100 has the configuration of a SOP. Contacts 38 located at the interior ends of the inner contact elements 32 protrude from the floor of the cavity 28 to make contact with the selected connection pads 12 on the chip 10. The inner contact elements 32 can comprise a Tape Automated Bonding (TAB) film having a conductive layer, or an Application Specific Material (ASMAT) from, e.g., Nitto Denko Corporation of Japan. In FIG. 8, the reference number 36 denotes the point at which an inner contact element 32 connects to an outer contact element 34. The configuration of the contact terminals 30 shown in FIG. 8 is one of many possible variations. For example, the inner contact element 32 may be integrated with the outer contact element 34 in a conventional "lead frame" of a type similar to those used in conventional semiconductor packages. Other desirable configurations will be readily apparent to persons of ordinary skill in the art.

The upper body 21, which is positioned above and aligned with the lower body 29, has an opening 22 to expose the cavity 28 in the lower body 29. The upper body 21 also includes a hole 23 at each of the four corners thereof The coupling means 40, described below, are received in the holes 23. The upper body 21 includes exterior sides 21a, and interior sides 21b, and mounts a plurality of resilient, comb-like, toothed clamps 50. The interior sides 21b of the upper body 21 are formed to include a plurality of parallel slots 24 through which the teeth of the clamps 50 protract toward, or retract away from, the opening 22 in response to an upward or downward vertical movement, respectively, of the upper body 21 relative to the lower body 29.

The coupling means 40 include coupling rods 42, and a spring 46 around each of the rods 42. A coupling rod 42 is located at each of four corners of the lower body 29 and extends into one of the holes 23 in the upper body 21. The spring 46 is resiliently compressed and expansive between the top surface 26 of the lower body 29 and a bottom surface 21c of the upper body 21. That is, the upper body 21 moves downward toward the lower body 29 along the coupling rods 42 when a force is applied to the top surface of the upper body, and is resiliently restored to its original position by the springs 46 when the force is removed.

The means for holding the chip 10 in the cavity 28 include the resilient clamps 50, a clamp deflector 60, and a retainer 70. The resilient clamps 50 are self-biased to move toward the opening 22 in the upper body 21 and hold the chip 10 in the cavity 28 when the upper body is spaced above the lower body 29 at a predetermined distance, and the clamp deflector 60 serves to deflect the clamps 50 to a retracted position away from the opening 22 with movement of the upper body 21 toward the lower body 29 for the loading and unloading of the chip 10 from the cavity 28.

The resilient clamps 50 each includes a toothed, arcuate jaw 52, a tail 56, and a resilient, flexible connecting arm 54 that connects the jaw 52 to the tail. The tail 56 is affixed to a lower part of the upper body 21. The jaw 52 is biased by the connecting arm 54 to extend toward and into the opening 22, with the tips of the jaw teeth facing the floor of the cavity 28. The connecting arm 54 links the jaw 52 to the tail 56 and, when deflected away from the opening 22, reacts like leaf spring to restore the jaw 52 into the opening 22.

The clamp deflector 60 opposes the connecting arm 54 and reacts with it to bend the arm away from the opening 22 in response to a downward movement of the upper body 21, so that the jaw 52 of the clamp 50 retracts out of the opening 22 through the slots 24. The clamp deflector 60 includes a support base 62 fixed on the lower body 29, a protrusion 62a extending upward from the support base 62 toward the connecting arm 54, and a rotating bar 64. The rotating bar 64 is rotatably coupled to the protrusion 62a and opposingly engages the connecting arm 54 of the clamp 50. In order to facilitate the flexure of the connecting arm 54 by the clamp deflector 60, and to prevent the connecting arm 54 from being damaged, the rotating bar 64 is preferably rotatable on a support rod 66 in response to sliding movement of the connecting arm 54 upon it. For this purpose, the rotating bar 64 shown in FIG. 8 is an elongated member having a triangular cross-section with a bore extending through it. The support rod 66 is inserted through the bore in such a way that the rotating bar 64 can rotate freely on the rod in response to the connecting arm 54 sliding on it. In the embodiment illustrated, the rotating bar 64 rotates on the support rod 66 such that one of the three sides of the bar remains in parallel contact with the arm 54 of the clamp 50.

As shown in FIG. 7, C-shaped retainers 70 clamp the upper body 21 and the lower body 29 together at a predetermined distance from one another such that when the retainers 70 are installed onto the carrier 100, the clamps 50 holds the chip 10 securely in the cavity 28. The lower body 29 and the upper body 21 have fitting grooves 25 to receive the retainers 70 and prevent them from disengaging from the carrier 100 during handling. When an external force is applied to the carrier 100, for example, during insertion of the carrier 100 into a test socket, the force is preferably applied to the retainers 70 only, so that the chip 10 remains securely retained and in good electrical contact with the terminals in the carrier 100. A carrier having the outer contact elements of an SOJ package or a DIP package can be inserted into a conventional test socket for an SOJ or a DIP package by simply pressing the carrier 100 into the socket. Thus, the carrier 100 has a horizontal configuration, i.e., length, width, lead spacing, etc., that is compatible with a test socket for a conventional SOP package, although it can have a height that is greater than a conventional SOP package.

The process of loading a chip 10 into the carrier 100 is now described. A pusher (not shown) presses down on the upper body 21, and not on the retainers 70, which are removed for chip loading. The force pushes the upper body 21 down against the springs 46 on the rods 40, bringing the connecting arms 54 of the clamps 50 into engagement with their respective clamp deflectors 60, causing the connecting arms 54 to bend upwardly and retract the toothed jaws 52 of the clamps 50 up and away from the opening 22 through the slots 24. A pick-and-place tool (not shown), equipped with, e.g., a vacuum collect, picks up a chip 10 at a remote location, and if necessary, inverts it and conveys it to a position above the carrier 100, aligns it with the opening 22, and places it in the cavity 28 such that the inner contact elements 38 contact selected ones of the connection pads 12 on the chip 10. After the chip 10 is loaded into the carrier, and while the pick-and-place tool is still holding the chip 10 in contact with the inner contact elements 38, the pusher retracts upwardly, releasing upper body 21 to move upwardly in response to the expansion of the springs 46. This upward movement of the upper body permits the connecting arms 54 to return to their original positions, thereby urging the teeth of the jaws 52 of the clamps 50 to flex downwardly through their corresponding slots 24 to contact the chip 10 at its margins, thereby clamping the chip in the cavity 28 with a forceful contact between the connection pads 12 on the chip and the inner contact elements 38 on the lower body 29. The load applied to the margin of the chip 10 by each jaw 52 is preferably in a range of from about 10 to about 20g.

When the jaws 52 of the clamps 50 have engaged the chip 10, the pick-and-place tool releases its grip on the chip 10 and moves up and away from the chip 10 to complete the chip loading process. The process of unloading the chip 10 from the carrier 100 is the reverse of the above-described procedure.

The mounting and testing of a carrier having a bare chip in it are performed using the same procedures commonly employed for mounting and testing a conventional packaged semiconductor device. For example, a vacuum pick-and-place tool carries the bare-chip test carrier to and aligns it above a test socket, then inserts the carrier into the socket such that the outer contact elements of the carrier electrically connect to the socket leads. After testing, the carrier is removed from the socket in a procedure that is the reverse of the above. Thus it may be seen that the present invention, as described above, is readily and efficiently adapted for use by conventional automated equipment for the handling, loading and unloading of conventional semiconductor packages.

The foregoing descriptions of the specific embodiments of the present invention have been presented for purposes of illustration and description. They are not intended to be exhaustive or to limit the invention to the precise forms disclosed, as many modifications and variations are possible in light of the above teaching. The embodiments were chosen and described in order to best explain the principles of the invention and its practical application, and to thereby enable others skilled in the art to best utilize the invention and various embodiments with various modifications as are suited to the particular use contemplated. It is intended that the scope of the invention be defined by the claims appended hereto and by their equivalents.

What is claimed is:

1. A test carrier for an unpackaged semiconductor chip, the carrier comprising:

a body having a cavity in it for receiving the unpackaged chip:

contact terminals, including inner contact elements and outer contact elements, disposed on the body, the inner contact elements being disposed on a floor of the cavity to make contact with selected ones of connection pads on the chip, the outer contact elements being disposed on an outer surface of the body and electrically connected to the inner contact elements, the body and the outer contact elements being configured to engagingly mate with a test socket into which the carrier is inserted, said test socket being adapted to receive a conventionally packaged chip; and, means for holding the chip in the cavity such that the inner contact elements are in electrical contact with the selected ones of the connection pads on the chip, said means for holding the chip in the cavity comprising:

a clamp rotatable disposed on the body for rotation into and out of the cavity the clamp having a jaw extending into the cavity, a tail extending out of the cavity, and an arm connecting the jaw to the tail such that a force exerted on the tail rotates the jaw of the clamp up and away from the floor of the cavity; and, means for rotatable biasing the jaw of the clamp down and toward the floor of the cavity.

2. The carrier of claim 1, wherein the arm of the clamp includes a semi-cylindrical bend rotatably supported by a semi-cylindrical groove in the body, and further comprising a pin extending through the body and the bend in the arm and retaining the bend in the groove.

3. The carrier of claim 1 wherein the body of the carrier includes a recess at a side of the cavity, and wherein the clamp is rotatably disposed within the recess to move into and out of the cavity.

4. The carrier of claim 1, wherein the inner contact elements protrude above the floor of the cavity to enhance the contact between the inner contact elements and the connection pads on the chip, and wherein the outer contact elements are electrically conductive bumps.

5. The carrier of claim 4, wherein the body and the outer contact elements are configured to engage and mate with a test socket for a conventional ball grid array ("BGA") semiconductor package.

6. The carrier of claim 1, wherein the body comprises:
   a lower body containing the cavity;
   an upper body disposed above the lower body, the upper body having an opening through it to expose the cavity; and,
   means for coupling the lower and upper bodies together, and for biasing them apart from each other.

7. The carrier of claim 6, wherein the
   tail of the clamp is resiliently affixed to a lower part of the upper body, and further comprising:
   means disposed on the lower body for slidably engaging the arm of the clamp in response to a movement of the upper body toward the lower body and for flexing the arm up and away from the opening such that the jaw of the clamp is rotationally retracted from the cavity through the opening.

8. The carrier of claim 7, further comprising a retainer for retaining the upper body and the lower body biased apart from each other at a predetermined distance.

9. The carrier of claim 7, wherein the jaw of the clamp comprises a plurality of arcuate teeth, and wherein an inner wall of the upper body adjacent to the opening includes a plurality of corresponding slots through which the teeth of the jaw protract into and retract out of the opening.

10. The carrier of claim 7, wherein the means for engaging and flexing the arm of the clamp upward comprise a bar mounted on the lower body below the arm.

11. The carrier of claim 10, wherein the bar is rotatably mounted on the lower body.

12. A carrier for use in testing an unpackaged semiconductor chip, the carrier comprising:
   a body having an open cavity in an upper surface thereof for receiving the unpackaged chip;
   contact terminals, including inner contact elements and outer contact elements, disposed on the body, the inner contact elements being disposed on a floor of the cavity to make contact with selected ones of connection pads on the chip, the outer contact elements being disposed on an outer surface of the body and electrically connected to the inner contact elements, the body and the outer contact elements being configured to engagingly mate with a test socket into which the carrier is inserted, said test socket being adapted to receive a conventional ball arid array ("BGA") type of semiconductor package; and,
   means for holding the chip in the cavity such that the inner contact elements are in electrical contact with the selected ones of the connection pads on the chip, said means for holding the chip in the cavity comprising a clamp rotatably disposed on the body for rotation into and out of the cavity, the clamp having a jaw extending into the cavity, a tail extending out of the cavity, and an arm connecting the jaw to the tail and being rotatable supported on the body such that a downward force applied to the tail of the clamp rotates the jaw of the clamp up and out of the cavity and such that an upward force on the tail rotates the jaw of the clamp down and into the cavity.

13. The carrier of claim 12, wherein the body has a recess at a side of the cavity, and wherein the means for holding the chip in the cavity are contained in the recess and extend into and out of the cavity to engage and disengage the chip.

14. The carrier of claim 13, wherein the clamp is rotatably mounted in the recess for rotation into and out of the cavity.

15. The carrier of claim 14, further comprising a resilient member disposed between the body and the tail of the clamp for biasing the tail upwardly.

16. A test carrier for an unpackaged semiconductor chip, comprising:
   a lower body having a cavity opening in an upper surface thereof;
   an upper body having inner walls defining an opening through the upper body, the opening corresponding in size to the cavity;
   means for supporting the upper body over the lower body in a biased-apart relationship, with the opening in alignment with the cavity;
   contact terminals, including inner contact elements and outer contact elements, disposed on the lower body, the inner contact elements being disposed on a floor of the cavity to make contact with selected ones of connection pads on the chip, the outer contact elements being disposed on an outer surface of the lower body and electrically connected to the inner contact elements, the lower body and the outer contact elements being configured to engagingly mate with a test socket into which the carrier is inserted, said test socket being adapted to receive a conventional semiconductor package; and,
   means, rotatable into and out of the cavity, for holding a chip in, and for releasing it from, the cavity in response to a movement of the upper body toward, and away from, the lower body, respectively,
   wherein means for holding a chip in the cavity and for releasing it therefrom comprises:
      a clamp having a tail resiliently fixed to the upper body, a jaw extending through the inner wall of the upper body and into the opening above the cavity, and an am connecting the jaw to the tail such that the jaw is therby biased downward and toward the cavity and,
      means for deflecting the arm and the clamp upwardly and outwardly from the cavity in response to a movement of the upper body toward the lower body.

17. The carrier of claim 16, wherein conductors are attached to the inner contact elements and extend to the outer contact elements.

18. The carrier of claim 16, wherein the means for deflecting the arm of the clamp comprise:
   a support base on the lower body adjacent to the cavity, the base having an upwardly extending protrusion thereon; and,
   a bar rotatably mounted on top of the protrusion in opposing engagement with the arm of the clamp.

19. The carrier of claim 16, wherein the test socket is adapted to receive a conventional semiconductor package of a type having leads.

* * * * *